United States Patent
Spaeth et al.

(10) Patent No.: US 11,646,730 B2
(45) Date of Patent: May 9, 2023

(54) DRIVER CIRCUIT FOR SWITCHING EDGE MODULATION OF A POWER SWITCH

(71) Applicant: Robert Bosch GmbH, Stuttgart (DE)

(72) Inventors: Alexander Spaeth, Muensingen (DE); Joachim Joos, Gerlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 93 days.

(21) Appl. No.: 17/252,461

(22) PCT Filed: Jul. 15, 2019

(86) PCT No.: PCT/EP2019/069003
§ 371 (c)(1),
(2) Date: Dec. 15, 2020

(87) PCT Pub. No.: WO2020/016178
PCT Pub. Date: Jan. 23, 2020

(65) Prior Publication Data
US 2021/0281257 A1 Sep. 9, 2021

(30) Foreign Application Priority Data
Jul. 17, 2018 (DE) .......................... 102018211841.8

(51) Int. Cl.
*H03K 17/74* (2006.01)
*H03K 17/16* (2006.01)
*H03K 17/687* (2006.01)

(52) U.S. Cl.
CPC ....... *H03K 17/164* (2013.01); *H03K 17/6877* (2013.01); *H03K 17/74* (2013.01)

(58) Field of Classification Search
CPC .. H03K 17/74; H03K 19/0036; H03K 17/687; H03K 17/567; H03K 17/6877
See application file for complete search history.

(56) References Cited

U.S. PATENT DOCUMENTS

| 5,910,746 A | * | 6/1999 | Fordyce | ............... H03K 17/567 327/478 |
| 7,667,524 B2 | * | 2/2010 | Thierry | .................... H03K 4/00 327/427 |
| 2017/0179944 A1 | | 6/2017 | Ngo et al. | |

FOREIGN PATENT DOCUMENTS

| CN | 106059552 A | 10/2016 |
| DE | 102009029694 A1 | 4/2010 |

(Continued)

OTHER PUBLICATIONS

International Search Report for PCT/EP2019/069003, dated Oct. 8, 2019.

*Primary Examiner* — Hai L Nguyen
(74) *Attorney, Agent, or Firm* — Norton Rose Fulbright US LLP; Gerard Messina

(57) ABSTRACT

A driver circuit for switching edge modulation of a power switch. The driver circuit includes a first driver circuit input including a downstream input node, and a power switch including an upstream first gate node. A charging path including a charging resistor is situated between the input node and the first gate node. A discharging path including a discharging resistor is situated between the input node and the first gate node. A gate path is situated between the input node and the first gate node. A power switch transistor, whose gate is connected to the first gate node, is provided. A gate path includes a gate resistor. The driver circuit is configured so that, during a switching process of the power switch, the gate path is temporarily short-circuited either via the charging path or the discharging path, to increase the slope of the switching behavior of the power switch.

6 Claims, 2 Drawing Sheets

(56) References Cited

FOREIGN PATENT DOCUMENTS

| | | |
|---|---|---|
| DE | 102012207147 A1 | 10/2013 |
| EP | 2466753 A1 | 6/2012 |
| JP | H1023743 A | 1/1998 |
| JP | 2010283973 A | 12/2010 |
| JP | 2013141409 A | 7/2013 |
| JP | 2015023774 A | 2/2015 |
| WO | 2017089321 A1 | 6/2017 |

\* cited by examiner

DRIVER CIRCUIT FOR SWITCHING EDGE MODULATION OF A POWER SWITCH

FIELD

The present invention relates to a driver circuit for switching edge modulation of a power switch.

BACKGROUND INFORMATION

Depending on use, driver circuits are also sometimes referred to as gate drivers, MOSFET drivers, IGBT drivers or half bridge drivers. In electronics, specifically in power electronics, they are used to activate a discrete or integrated electronic circuit which includes power switches, such as MOSFET or IGBT. When a transistor is switched, it does not instantaneously transition from the non-conducting into the conducting state (or vice versa). Rather, depending on the charge voltage of the gate capacitance, the transistor runs through a certain resistance range. During switching while current is flowing, a more or less high power is converted in the transistor, which heats it and, in the most unfavorable case, may even damage it. It is therefore regularly desirable to design the switching process of the transistor to be as short as possible to keep the switching losses as low as possible.

Fast switching processes cause overvoltages due to a sudden commutation of the current at internal parasitics of the connected electronics components. In particular, modern electrical systems of rail vehicles/airplanes (having voltages of, for example, 24 V/48 V) regularly have a lower tolerance with respect to overvoltages (than, for example, 12 V vehicle electrical systems). At the same time, electromagnetic compatibility (EMC) is increasingly gaining in importance due to progressing miniaturization, and component-damaging overvoltages should be avoided to the extent possible.

In the related art, a driver circuit may be connected upstream from a gate series resistor to improve the EMC emissions (for example to adhere to the CISPR 22 standard) and to reduce the overvoltage, which subsequently slows down the switching process. As a result, however, increased switching losses arise. The generated heat then has to be dissipated by additional cooling. Overall, the efficiency and the service life of the power switch thus worsen.

SUMMARY

According to the present invention, a driver circuit for the switching edge modulation of a power switch is provided. In accordance with an example embodiment of the present invention, the driver circuit includes:
- a first driver circuit input including a downstream input node;
- a power switch including an upstream first gate node;
- a charging path situated between the input node and the first gate node, including a charging resistor;
- a discharging path situated between the input node and the first gate node, including a discharging resistor;
- a gate path situated between the input node and the first gate node, including a gate resistor;
- a power switch transistor, whose gate is connected to the first gate node,
the driver circuit being configured in such a way that, during a switching process of the power switch, the gate path is temporarily short-circuited either via the charging path or the discharging path, to increase the slope of the switching behavior of the power switch.

Due to the above-described overvoltage risk, a higher safety has to be calculated when designing power switches to protect the power switch, resulting in additional costs in the design and the production of the power switches. The approach according to the present invention allows the spectrum of the voltage fluctuations to be improved by modulating the switching edges, without the losses increasing. In this way, a greater slope may be achieved in the middle portion of the switching edge, compared to the conventional gate series resistor control.

At the same time, a power switch having a lower voltage class may be selected by reducing/avoiding the overvoltage, whereby the on resistance (RDSON) becomes disproportionately smaller at the same chip surface. Consequently, the conduction losses decrease, and an improvement in the efficiency of the power switch is achieved.

A main aspect of the present invention in the process is the short circuiting of the gate path (in particular, of the gate resistor) at certain switching times. In this way, the slope of the switching edge of the power switch may be temporarily increased, and the losses may be decreased. By varying the gate series resistance during charging or discharging, the peak current in the power switch may be limited by the driver circuit, despite the short circuit. The gate series resistance here shall be understood to mean the effective resistance (across one or multiple path(s)) between the driver circuit input and the gate of the power switch. To reduce the overvoltage, the charging path and the discharging path may each be blocked in a timely manner during a switching process. In this way, it is possible to modulate the shape of the switching edges, and both avoid overvoltages and limit losses.

Both the off-process and the on-process may be modulated using this type of modulation. The discharging path is used for modulating the off-process, while the charging path is used for modulating the on-process. Tests show considerably more subdued fluctuations in the phase voltage and the output voltage of a connected DC-DC converter. The greater slope of the switching edge in the middle of the switching process and the shorter switching time result in lower switching losses at improved EMC emission. Despite an increased gate series resistance of the power switch, an enhanced performance may thus be achieved as a result of bridging at non-critical points in time.

In one preferred specific embodiment of the present invention, the driver circuit 1, 20 is configured in such a way that the charging path and the discharging path are blocked at the beginning and the end of a switching process for overvoltage reduction. In these areas of the switching process, the gate of the power switch is thus only activated via the gate resistor in the gate path. In this way, an overvoltage at the beginning and end of the switching process may be avoided, despite a steeper switching edge in the "middle" of the switching process.

In one further specific embodiment of the present invention, the discharging path includes the following components between the input node and the first gate node, in this order:
- a discharging path transistor, which is situated in parallel to a first discharging path diode situated in the conducting direction;
- the discharging resistor; and
- a second discharging path diode, which is situated in the non-conducting direction.

The second discharging path diode determines in this instance that a flow through the discharging path is only possible during a discharging process. The discharging path transistor allows the discharging path to be selectively blocked during a switching process.

In one further specific embodiment of the present invention, the charging path includes the following components between the input node and the first gate node, in this order:
- a first charging path diode, which is situated in the conducting direction;
- the charging resistor; and
- a charging path transistor, which is situated in parallel to a second charging path diode situated in the non-conducting direction.

The first charging path diode determines in this instance that a flow through the charging path is only possible during a charging process. The charging path transistor allows the charging path to be selectively blocked during a switching process.

In one specific embodiment of the present invention, the driver circuit includes a second driver stage including a second driver circuit input, a second gate node to which the second driver stage is connected being situated between the first gate node and the gate of the power switch transistor. For additionally modulating the upper switch-off edge transition as well as the lower switch-on edge transition, the low-resistance gate path may then be blocked, and current may be impressed via a further driver stage, or current may be discharged during switch-on. In this way, the beginning or the end of the switching edge may be even further "rounded out" and the fluctuations may be reduced.

In one further specific embodiment of the present invention, the following components are situated in the second driver stage between the second driver circuit input and the second gate node, in this order:
- a limiting resistor; and
- a limiting diode in the conducting direction.

Using this design, it is possible to achieve an additional modulation of the upper switch-off edge transition as well as of the lower switch-on edge transition in an uncomplicated manner.

Advantageous refinements of the present invention are described herein and shown in the figures.

BRIEF DESCRIPTION OF THE DRAWINGS

Exemplary embodiments of the present invention are described in greater detail based on the figures and the following description.

DETAILED DESCRIPTION OF EXAMPLE EMBODIMENTS

Figure 1:
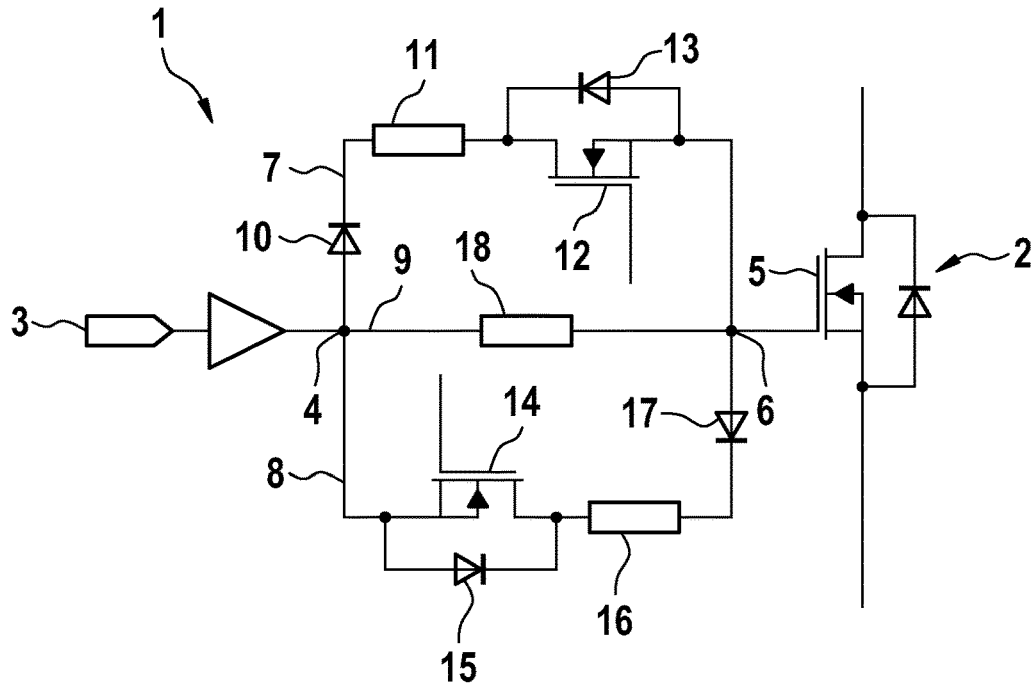
FIG. 1 shows a circuit diagram of a first specific embodiment of a driver circuit according to the present invention.

FIG. 1 shows a circuit diagram of a first specific embodiment of a driver circuit 1 according to the present invention of a power switch 2. Driver circuit 1 includes a first driver circuit input 3 including a downstream input node 4. Driver circuit 1 furthermore includes a power switch transistor 5 including an upstream first gate node 6.

A charging path 7, a discharging path 8, and a gate path 9 are situated between input node 4 and first gate node 6. A gate of power switch transistor 5 of power switch 2 is connected to first gate node 6. Driver circuit 1 is configured in such a way that, during a switching process of power switch 2, gate path 9 is temporarily short-circuited either via charging path 7 or discharging path 8, to increase the slope of the switching behavior of power switch 2. Charging path 7 and discharging path 8 are blocked at the beginning and end of a switching process for overvoltage reduction.

Starting at input node 4, the following components are situated in charging path 7 in the direction toward first gate node 6:
- a first charging path diode 10, which is situated in the conducting direction;
- a charging resistor 11; and
- a charging path transistor 12, which is situated in parallel to a second charging path diode 13 situated in the non-conducting direction.

Starting at input node 4, the following components are situated in discharging path 8 in the direction toward first gate node 6:
- a discharging path transistor 14, which is situated in parallel to a first discharging path diode 15 situated in the conducting direction;
- a discharging resistor 16; and
- a second discharging path diode 17, which is situated in the non-conducting direction.

A gate resistor 18 is situated in gate path 8 between input node 4 and gate node 6.

Figure 2:
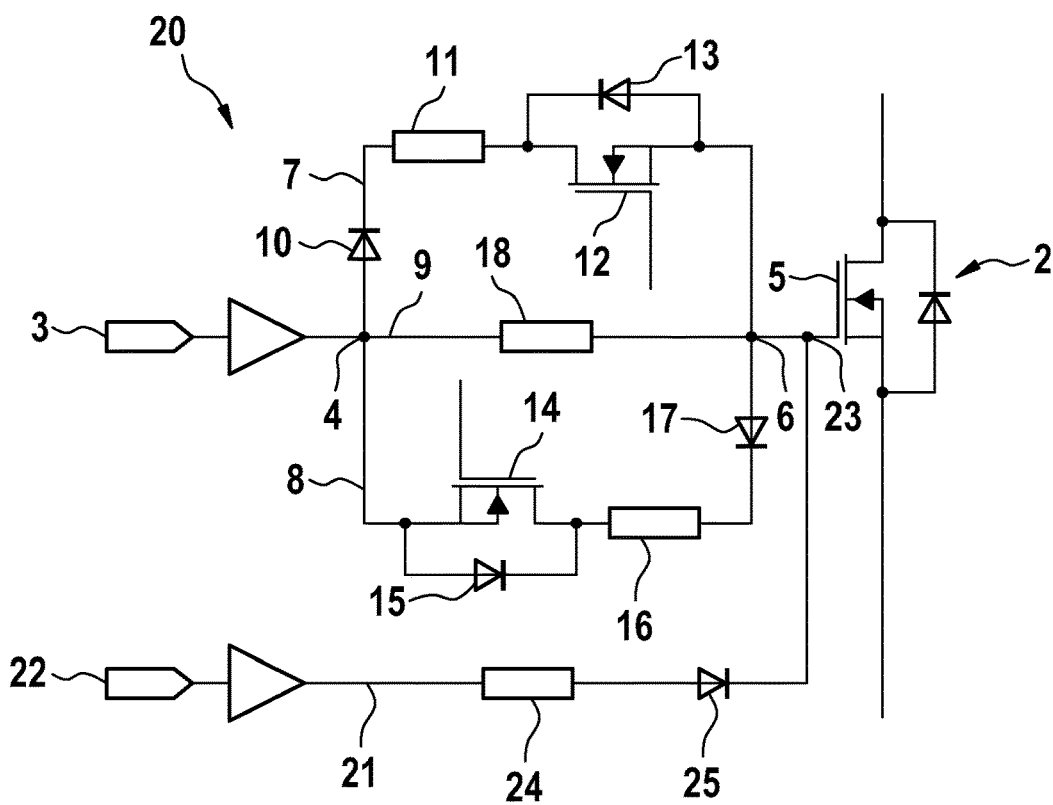
FIG. 2 shows a circuit diagram of a second specific embodiment of a driver circuit according to the present invention.

FIG. 2 shows a second specific embodiment of a driver circuit 20 according to the present invention. Corresponding features are denoted by the same reference numerals. In addition to the switching components shown in FIG. 1, driver circuit 20 includes a second driver stage 21.

All components of driver circuit 20 between first driver circuit input 3 and first gate node 6 may be understood as the first driver stage. Reference is made in this regard to the description of FIG. 1.

Second driver stage 21 includes a second driver circuit input 22, a second gate node 23 to which second driver stage 21 is connected being situated between first gate node 6 and the gate of power switch transistor 5. Starting from second driver circuit input 22 in the direction toward second gate node 23, the following components are situated in second driver stage 21, in this order:
- a limiting resistor 24; and
- a limiting diode 25 in the conducting direction.

Driver circuits 1, 20 according to the present invention allow gate path 9, and, in particular, gate resistor 18, to be short-circuited at certain switching times. The slope of the switching edge of the power switch may thus be temporarily increased, and the losses may be decreased. By varying the effective gate series resistance with the aid of charging resistor 11 and discharging resistor 16, the peak current in power switch 2 may be limited by driver circuit 1, 20, despite the short circuit. For overvoltage reduction, charging path 7 and discharging path 8 may each be blocked in a timely manner during a switching process. In this way, it is possible to modulate the shape of the switching edges, and to avoid both overvoltages and limit losses.

Driver circuit 20 shown in FIG. 2 allows an additional modulation of the upper switch-off edge transition as well as of the lower switch-on edge transition in that current may be impressed via second driver stage 21. Using this design, it is possible to achieve an additional modulation of the upper switch-off edge transition as well as of the lower switch-on edge transition in an uncomplicated manner.

Figure 3:
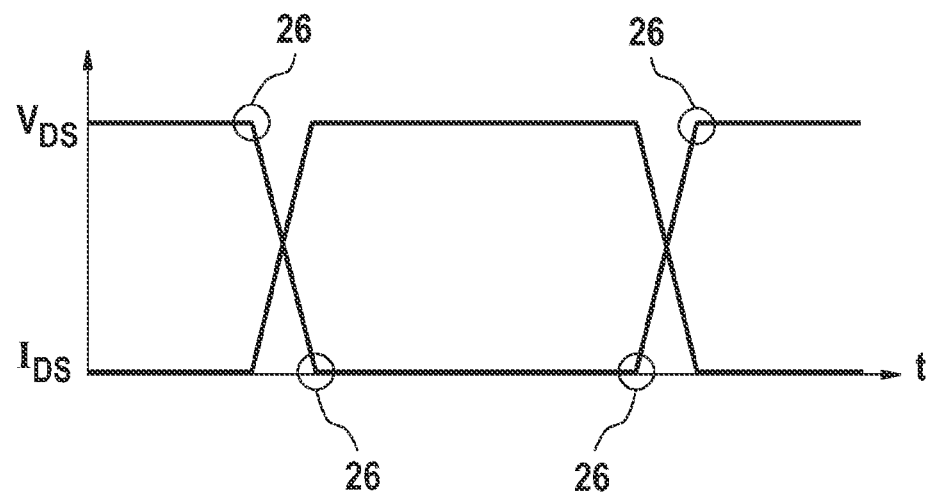
FIG. 3 shows a simplified chart of the drain current and the drain voltage of a power switch in the related art.
Figure 4:
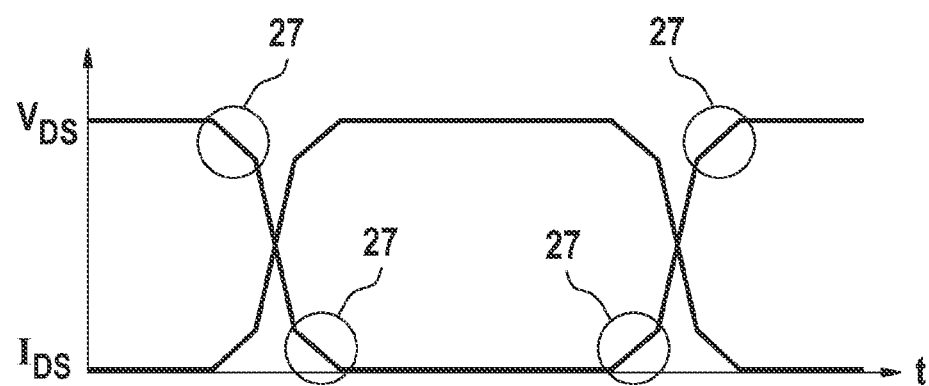
FIG. 4 shows a simplified chart of the drain current and the drain voltage of a power switch including a driver circuit according to the present invention.

FIGS. 3 and 4 illustrate the main effect of the present invention. In a simplified chart, the drain current and the drain voltage of a power switch against time t are shown in each case over two switching processes.

FIG. 3 shows drain current $I_{DS}$ and drain voltage $V_{DS}$ of a power switch in the related art. Switching edges 26 of drain voltage $V_{DS}$ are comparatively sharp and result in overvoltages when the duration of the switching process via the magnitude of the gate resistance is selected to be too short. In this way, the only choice that remains is, depending on the application, to select the gate resistance to be relatively large, and thereby tolerate larger switching losses.

FIG. 4 shows drain current $I_{DS}$ and drain voltage $V_{DS}$ of a power switch including a driver circuit 1, 20 according to an example embodiment of the present invention. Here, switching edges 27 of drain voltage $D_{VS}$ are now flatter and no longer result in overvoltages, even when the duration of the switching process in the middle of the switching process via the magnitude of the effective gate series resistance of the gate of power switch 2 is selected to be relatively short. The effective gate series resistance is the variable effective resistance between first or second driver circuit input 3, 22 and the gate of power switch 2. The greater slope of the switching edge in the middle of the switching process and the shorter switching time result in lower switching losses at improved EMC emission. Despite an increased effective gate series resistance in the middle of the switching process, an enhanced performance may thus be achieved as a result of bridging at non-critical points in time.

What is claimed is:

1. A driver circuit for switching edge modulation of a power switch, comprising:
    a first driver circuit input including a downstream input node;
    a power switch including an upstream first gate node;
    a charging path situated between the input node and the first gate node, including a charging resistor;
    a discharging path situated between the input node and the first gate node, including a discharging resistor;
    a gate path situated between the input node and the first gate node, including a gate resistor; and
    a power switch transistor, a gate of the power switch transistor being connected to the first gate node;
    wherein the driver circuit being configured in such a way that, during a switching process of the power switch, the gate path is temporarily short-circuited either via the charging path or the discharging path, to increase a slope of a switching behavior of the power switch.

2. The driver circuit as recited in claim 1, wherein the driver circuit is configured in such a way that the charging path and the discharging path are blocked at a beginning and end of the switching process for overvoltage reduction.

3. The driver circuit as recited in claim 1, wherein the following components are situated in the discharging path between the input node and the first gate node, in the following order:
    a discharging path transistor, which is situated in parallel to a first discharging path diode situated in a conducting direction;
    the discharging resistor; and
    a second discharging path diode, which is situated in a non-conducting direction.

4. The driver circuit as recited in claim 1, wherein the following components are situated in the charging path between the input node and the first gate node, in the following order:
    a first charging path diode, which is situated in a conducting direction;
    the charging resistor; and
    a charging path transistor, which is situated in parallel to a second charging path diode situated in a non-conducting direction.

5. The driver circuit as recited in claim 1, further comprising:
    a second driver stage including a second driver circuit input, a second gate node to which the second driver stage is connected being situated between the first gate node and the gate of the power switch transistor.

6. The driver circuit as recited in claim 5, wherein the following components are situated in the second driver stage between the second driver circuit input and the second gate node, in the following order:
    a limiting resistor; and
    a limiting diode in a conducting direction.

* * * * *